United States Patent
Chen et al.

(10) Patent No.: US 9,620,362 B2
(45) Date of Patent: Apr. 11, 2017

(54) SEED LAYER STRUCTURE FOR GROWTH OF III-V MATERIALS ON SILICON

(71) Applicant: Taiwan Semiconductor Manufacturing Co., Ltd., Hsin-Chu (TW)

(72) Inventors: Chi-Ming Chen, Zhubei (TW); Chung-Yi Yu, Hsin-Chu (TW); Po-Chun Liu, Hsinchu (TW)

(73) Assignee: Taiwan Semiconductor Manufacutring Co., Ltd., Hsin-Chu (TW)

( * ) Notice: Subject to any disclaimer, the term of this patent is extended or adjusted under 35 U.S.C. 154(b) by 0 days.

(21) Appl. No.: 14/699,046

(22) Filed: Apr. 29, 2015

(65) Prior Publication Data
US 2016/0322225 A1 Nov. 3, 2016

(51) Int. Cl.
*H01L 29/66* (2006.01)
*H01L 21/02* (2006.01)
*H01L 29/205* (2006.01)
*H01L 29/778* (2006.01)

(52) U.S. Cl.
CPC .... *H01L 21/02694* (2013.01); *H01L 21/0251* (2013.01); *H01L 21/0254* (2013.01); *H01L 21/02381* (2013.01); *H01L 21/02458* (2013.01); *H01L 21/02505* (2013.01); *H01L 29/205* (2013.01); *H01L 29/66462* (2013.01); *H01L 29/7787* (2013.01)

(58) Field of Classification Search
CPC ............................... H01L 33/00; H01L 29/66
USPC ........................................................ 257/76
See application file for complete search history.

(56) References Cited

U.S. PATENT DOCUMENTS

| 9,525,054 B2 | 12/2016 | Chiang et al. |
| 2006/0261370 A1* | 11/2006 | Hoke .................. H01L 29/7787 257/194 |
| 2009/0057646 A1* | 3/2009 | Hirayama ........... H01L 21/0237 257/13 |

OTHER PUBLICATIONS

Imura, et al. "Annihilation mechanism of threading dislocations in AlN grown by growth form modification method using V/III ratio." Journal of Crystal Growth 300 (2007) 136-140. Dec. 22, 2006.
Feng, et al. "Competitive growth mechanisms of AlN on Si (111) by MOVPE." Scientific Reports, 4:6416, Sep. 18, 2014. Retrieved from http://www.nature.com/srep/2014/140918/srep06416/full/srep06416.html.

(Continued)

*Primary Examiner* — Tran Tran
(74) *Attorney, Agent, or Firm* — Eschweiler & Potashnik, LLC

(57) ABSTRACT

The present disclosure relates to a structure and method of forming a GaN film on a Si substrate that includes an additional or second high temperature (HT) AlN seed layer, introduced for reducing the tensile stress of GaN on a Si substrate. The second HT AlN seed layer is disposed over a first HT AlN seed layer, and has a low V/III ratio compared to the first HT AlN seed layer. The second HT AlN seed layer has better lattice matching between Si and GaN and this reduces the tensile stress on GaN. The additional HT AlN seed layer further acts as a capping layer and helps annihilate or terminate threading dislocations (TDs) originating from a LT AlN seed layer. The second HT AlN seed layer also helps prevent Si diffusion from the substrate to the GaN film.

20 Claims, 7 Drawing Sheets

(56) References Cited

OTHER PUBLICATIONS

Fan, et al. "Effects of AlN nucleation layer thickness on crystal quality of AlN grown by plasma-assisted molecular beam epitaxy." Chin. Phys. B vol. 19, No. 11 (2010) 116801. May 11, 2010.
Liu, et al. "Growth of high quality AlN on sapphire by using a low-temperature AlN interlayer." Proc. of SPIE vol. 7216 72160I-1. Published 2009.
Science24.com "2D and 3D Growth Mode of Nitride Layers." Jan. 14, 2015.

* cited by examiner

Fig. 9

900 →
- 110 — Graded buffer layer
- 108' — Third III-N seed layer
- 106' — Second III-N seed layer
- 104' — First III-N seed layer
- 102 — Substrate 103' brackets layers 104', 106', 108'.

Fig. 10

1000 →
- 112 — Isolation layer
- 110 — Graded buffer layer
- 108' — Third III-N seed layer
- 106' — Second III-N seed layer
- 104' — First III-N seed layer
- 102 — Substrate 103' brackets layers 104', 106', 108'.

US 9,620,362 B2

SEED LAYER STRUCTURE FOR GROWTH OF III-V MATERIALS ON SILICON

BACKGROUND

High-electron-mobility transistors (HEMTs), also known as heterostructure FETs (HFETs) or modulation-doped FETs (MODFETs), are field-effect transistors incorporating a junction between two materials with different band gaps (i.e. a heterojunction) as the channel instead of a doped region (as is generally the case for MOSFETs). III-N (tri nitride) devices, such as AlGaN/GaN devices, are one type of HEMT that show very promising performance in high-power and high-frequency applications. III-N devices can be used, for example, in high power-high frequency applications such as emitters for cell phone base stations, Direct Broadcast Satellite (DBS) receivers, electronic warfare systems, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-13 illustrate cross-sectional views of some embodiments of a semiconductor structure at various stages of manufacture, provided to illustrate the method of FIG. 5.

DETAILED DESCRIPTION

Figure 1:
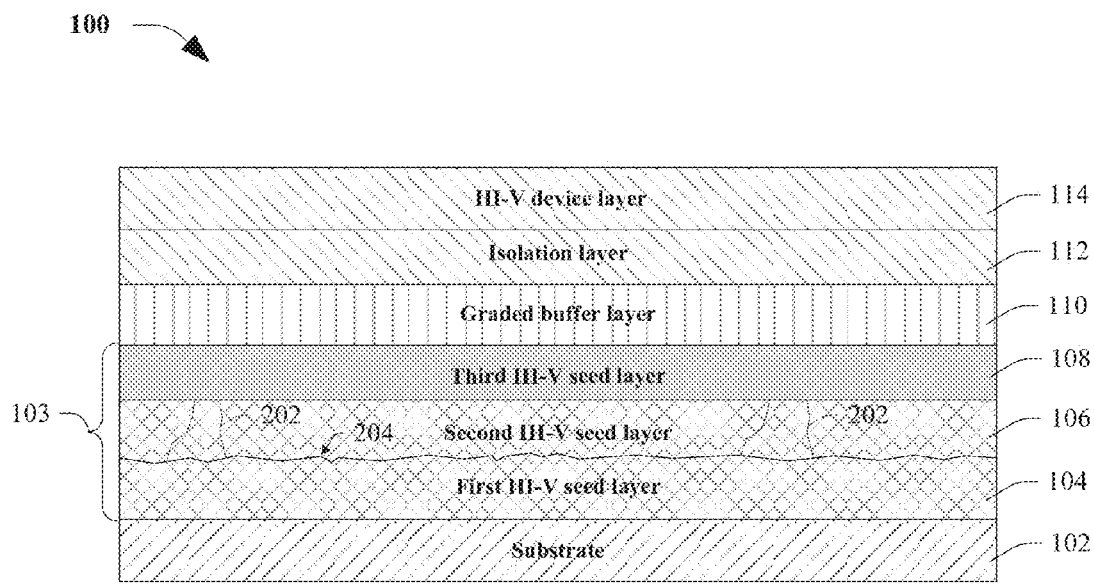
FIG. 1 illustrates a cross-sectional view of a semiconductor structure including a third III-V seed layer, formed according to some embodiments of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures "first", "second", "third", etc. are not intended to be descriptive of the corresponding element. Therefore, "a first dielectric layer" described in connection with a first figure may not necessarily corresponding to a "first dielectric layer" described in connection with another figure.

Group III-V semiconductors offer good potential for application in a wide range of electro-optical and high-power microelectronic devices due to their wide band gap characteristics. Group III-V semiconductor devices are typically manufactured by growing III-V material on another substrate, due to the expense and difficulty of manufacturing bulk III-V material wafers. For example, FIG. 1 shows an example of a semiconductor structure 100 where a device layer of III-V material 114, such as GaN (gallium nitride), InP (indium phosphide) or GaAs (gallium arsenide) for example, is deposited over a substrate 102, such as a silicon, sapphire, or silicon carbide substrate, for example. Silicon is a favorable material for the substrate 102 because it is inexpensive, available in wafers with large diameters and offers very attractive potential for incorporating III-V devices onto Si-based very large-scale integrated circuits. Additionally, back end grinding and lapping needed for packaging is well developed for Si wafers, although sapphire or silicon carbide substrates also have advantages. Whatever substrate is used, due to the large difference in lattice constant, crystal structure, and thermal expansion coefficient between the III-V device layer 114 and substrate 102, it is rather difficult to epitaxially grow the III-V device layer 114 directly on substrate 102. Accordingly, a buffer layer 103 is disposed over the substrate 102 to reduce lattice mismatch between the substrate 102 and the III-V device layer 114.

Figure 2:
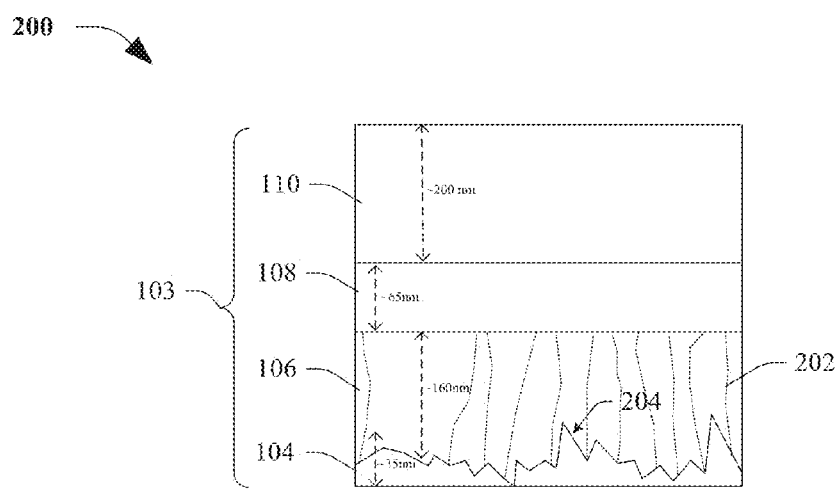
FIG. 2 illustrates a cross-sectional view of a semiconductor structure formed according to some embodiments of the present disclosure.

To grow such a buffer layer 103, multiple seed layers are used. Referring to FIGS. 1-2 concurrently, a first III-V seed layer 104, which has a first ratio of group V atoms to group III atoms, is grown at a low temperature (LT). The LT III-V seed layer 104 facilitates good lattice matching, but may have poor crystal quality and may contain threading dislocations 202 (and/or other crystallographic defects associated with stress) which extend vertically within the first III-V seed layer 104. The first III-V seed layer 104 may have an upper surface that exhibits a series of peaks and valleys, which can be regular or irregular, and which may be referred to as being a saw tooth surface. Subsequently, a second III-V seed layer 106, which can have a second ratio of group V atoms to group III atoms, is grown over the first III-V seed layer 104 at a high temperature (HT). Due to their manners of growth, the first and second III-V seed layers 104, 106 may meet at saw toothed interface 204. The second III-V seed layer 106 may tend to reduce threading dislocations 202, as the threading dislocations are thought to bend towards each other due to the change in lattice structure and thereby get annihilated. Thus, the second III-V seed layer 106 improves epitaxial quality of the buffer layer 103. However, unless the first III-V seed layer 104 is grown to at least some predetermined thickness, the second III-V seed layer 106 and subsequent III-V substrate material layers formed over the buffer layer 103 will still experience high stress due to lattice mismatch, increasing the risk of layer separation. When the first seed layer 104 is grown to this predetermined thickness, the threading dislocations 202 can be of sufficient size to lead to V-shaped cracks in a top surface of the second III-V seed layer 106. Absent countermeasures, these V-shaped cracks in the upper surface of the second III-V seed layer 106 may eventually lead to burning out of devices formed over it.

In view of the foregoing, the semiconductor structure 100 includes a third seed layer 108 to reduce tensile stress, which would otherwise occur due to equal and opposite internal forces being applied to the lattice of III-V device layer 114 formed over the substrate 102. The third III-V seed layer 108 further acts as a capping layer that reduces threading dislocations 202 and/or other lattice defects and accordingly, this third III-V seed layer 108 can effectively reduce threading dislocation effects as well. In particular, to achieve this reduction in tensile stress/threading dislocations, the third III-V seed layer 108 is grown by a high temperature process and has a third ratio of group V atoms to group III atoms. In some embodiments, for example, the third ratio of group V atoms to group III atoms is less than the second ratio. For example, in some embodiments, the second V/III ratio for the second seed layer 106 can range between approximately 2500:1 to approximately 5000:1; while the third V/III ratio for the third seed layer 108 can range between 200:1 and 1000:1. As an example where the III-V material is AlN, the lattice of the second seed layer 106 can exhibit 2500 Al atoms for each N atom (e.g., a second ratio of 2500:1), while the lattice of the third seed layer 108 can exhibit 200 Al atoms for each N atom (e.g., a third ratio of 200:1). The third III-V seed layer 108 with its lower V/III ratio has a better lattice matching with the III-V device layer 114, compared to the second III-V seed layer 106.

A graded buffer layer 110 can be disposed over the third III-V seed layer 108. Graded buffer layer 110 provides additional lattice matching between the buffer layer 103 and the III-V device layer 114 which is formed above the graded buffer layer 110. In some embodiments, the graded buffer layer 110 comprises a group III-V compound layer (e.g. AlGaN) and has varying concentrations for group III and group V elements as a function of depth. An isolation layer 112 separates the graded buffer layer 110 from the III-V device layer 114. In some embodiments, the isolation layer 112 comprises a doped III-V compound layer which is doped, for example with carbon, to reduce diffusion of atoms from the substrate 102 into the III-V device layer 114. The third III-V seed layer 108 also helps in reducing diffusion of atoms from the substrate 102 to the III-V device layer 114 and thus helps in maintaining a resistivity of the isolation layer 112.

FIG. 2 illustrates a cross-sectional view 200 of some layers of semiconductor structure 100 formed according to some embodiments of the present disclosure. FIG. 2 represents interfaces between different layers within the buffer layer 103. FIG. 2 also illustrates threading dislocations 202 existing within the second III-V seed layer 106. The third III-V seed layer 108, which is grown at a high temperature, helps in annihilating or terminating the threading dislocations 202 and thus helps in providing a suitable substrate surface for the growth of graded buffer layer 110. In some embodiments, a thickness of the first III-V seed layer 104 is set to a range of approximately 20 nm to approximately 100 nm, a thickness of the second III-V seed layer 106 is set to a range of approximately 50 nm to approximately 200 nm, a thickness of the third III-V seed layer 108 is set to a range of approximately 30 nm to approximately 150 nm, and a thickness of the graded buffer layer 110 is set to a range of approximately 0.2 μm to approximately 1.5 μm.

In some embodiments, the substrate 102 comprises Si, and the buffer layer 103 comprises multiple layers of AlN grown at different temperatures and having different V/III ratios. The graded buffer layer 110 can manifest as a layer of AlGaN having varying concentrations of Al and Ga as a function of depth, or multiple layers of AlGaN. The isolation layer 112 comprises GaN which is heavily doped with a carbon (C) concentration greater than 1e19 $cm^{-3}$ and the III-V device layer 114 comprises GaN which is lightly doped with a carbon concentration less than 1e17 $cm^{-3}$. The isolation layer 112 has a resistivity that is higher than that of the III-V device layer 114 to help limit current leakage, for example, between the substrate 102 and the III-V device layer 114.

Figure 3:
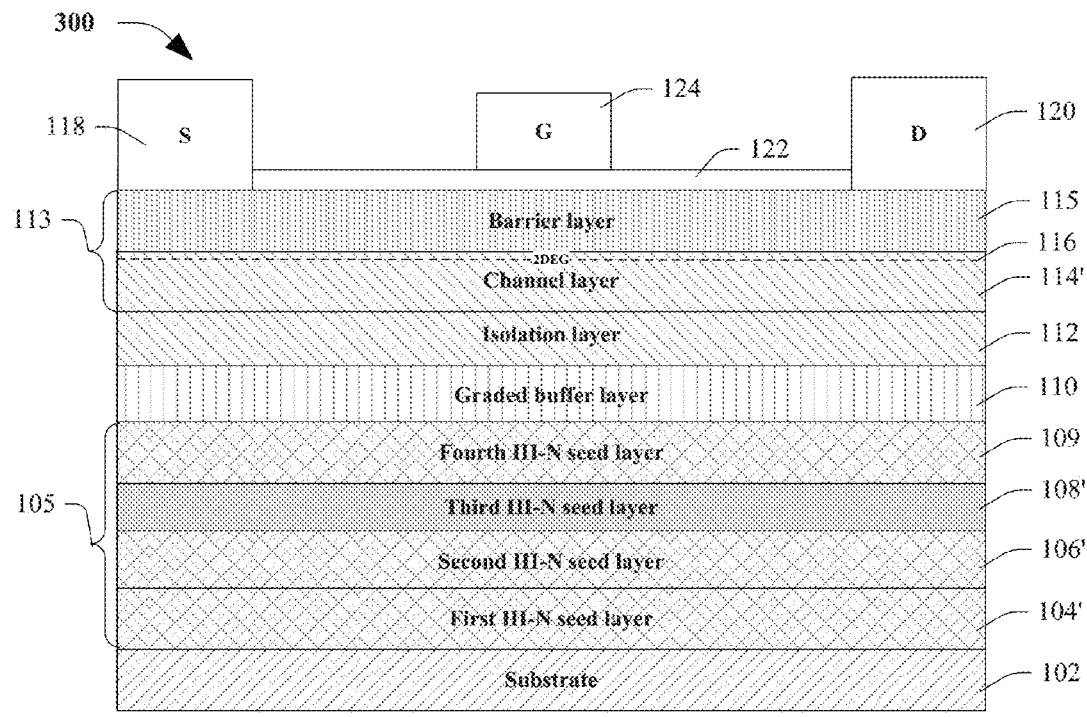
FIG. 3 illustrates some embodiments of a cross sectional view of a III-N HEMT device, with a third III-N seed layer formed in accordance with the present disclosure.

FIG. 3 illustrates some embodiments of a cross sectional view of a tri-nitride (III-N) HEMT device 300 formed in accordance with the present disclosure. III-N HEMT device 300 has a buffer layer 105 formed over the substrate 102. Buffer layer 105 includes a first III-N seed layer 104', a second III-N seed layer 106' and a third III-N seed layer 108' where the third III-N seed layer 108' has a V/III ratio smaller than a V/III ratio of the second III-N seed layer 106'. Both the second and third III-N seed layer 106' and 108' respectively are formed at high temperature conditions and the first III-N seed layer 104' is formed at low temperature conditions. The third III-N seed layer 108' helps relax the stress of subsequent III-N substrate materials formed above it and helps in reducing threading dislocations originating from the first III-N seed layer 104'. Buffer layer 105 further includes a fourth III-N seed layer 109 which is formed over the third III-N seed layer 108' for reducing surface roughness. The fourth III-N seed layer 109 has a higher V/III ratio than the V/III ratio of the third III-N seed layer 108' and hence has a better and smoother surface. Formation of the fourth III-N seed layer 109 is optional. In some embodiments, the buffer layer 105 comprises different layers of AlN.

A heterojunction structure 113, which is an example of a III-V device structure, comprises a III-V channel layer 114', which has a first bandgap, and a barrier layer 115, which has a second, different bandgap and which is arranged on top of the isolation layer 112. A two dimensional electron gas (2-DEG) 116 is formed near the heterojunction interface between the III-V channel layer 114' and the barrier layer 115. In some embodiments, the heterojunction structure 113 comprises an AlGaN/GaN junction. In various embodiments, the barrier layer 115 of the heterojunction structure 113 comprises $Al_{0.25}GaN$, AlN\\$Al_{0.25}$GaN\\u-GaN (unintentionally doped GaN), AlN\\$Al_{0.25}$GaN\\p-GaN or AlN\\$Al_{0.25}$GaN\\p-GaN\\n-GaN. A source region 118 and a drain region 120 are disposed over an upper surface of the heterojunction structure 113 and are arranged at two end locations of the barrier layer 115 of semiconductor structure 100. In some embodiments, the source and drain regions 118 and 120, can extend deeper in to the barrier layer 115 of the heterojunction structure 113 and reside at some level within the height of the barrier layer 115 or extend further in to the 2DEG channel 116 at the interface between the III-V channel layer 114' and the barrier layer 115. A gate insulator 122 resides over the heterojunction structure 113 between the source 118 and drain 120 regions. In various embodiments, the gate insulator 122 may comprise silicon nitride (SiN), aluminum oxide (AlO$_3$), silicon dioxide (SiO$_2$), or other appropriate insulating materials. A gate electrode 124 resides over a specific region of the gate insulator 122. In some embodiments, the source region 118, the drain region 120 and the gate electrode 124 are formed by selectively depositing metals like Ti/Al/Ni/Au.

During operation, a voltage applied to the gate electrode 124 controls the flow of carriers (e.g., 2DEG) from the source region 118 to the drain region 120 through a channel region 116 in the heterojunction structure 113. Thus, whether the III-N HEMT device 300 is in a conductive or resistive state can be controlled by controlling the 2DEG 116 with the help of the gate electrode 124. In many cases HEMT devices are enhancement mode (E-mode) devices, which operate similar to silicon MOSFET devices by normally being in a non-conducting state (normally off). Due to the nature of the AlGaN/GaN interface, and the formation of the 2DEG at the interface of AlGaN and GaN materials in HEMTs, such devices that are formed in the III-N materials system tend to be normally on, or depletion mode (D-mode) devices. i.e.; the high electron mobility of the 2DEG at the interface of the AlGaN/GaN layers permits the III-N device, such as a HEMT device, to conduct without the application of a gate potential.

The HEMT device 300 can correspond to a D-mode or E-mode MISFET (metal-insulator-semiconductor field-effect transistor). In some embodiments, the barrier layer 115 of an E-mode or D-mode MISFET of structure 300 comprises Al$_{0.25}$GaN with a thickness of approximately 10 nm to approximately 30 nm, or can include a tri-layer structure of AlN\Al$_{0.25}$GaN\u-GaN with approximate thicknesses of (0.2 nm-1.5 nm)\(10 nm-30 nm)\(2 nm-20 nm), respectively.

Figure 4:
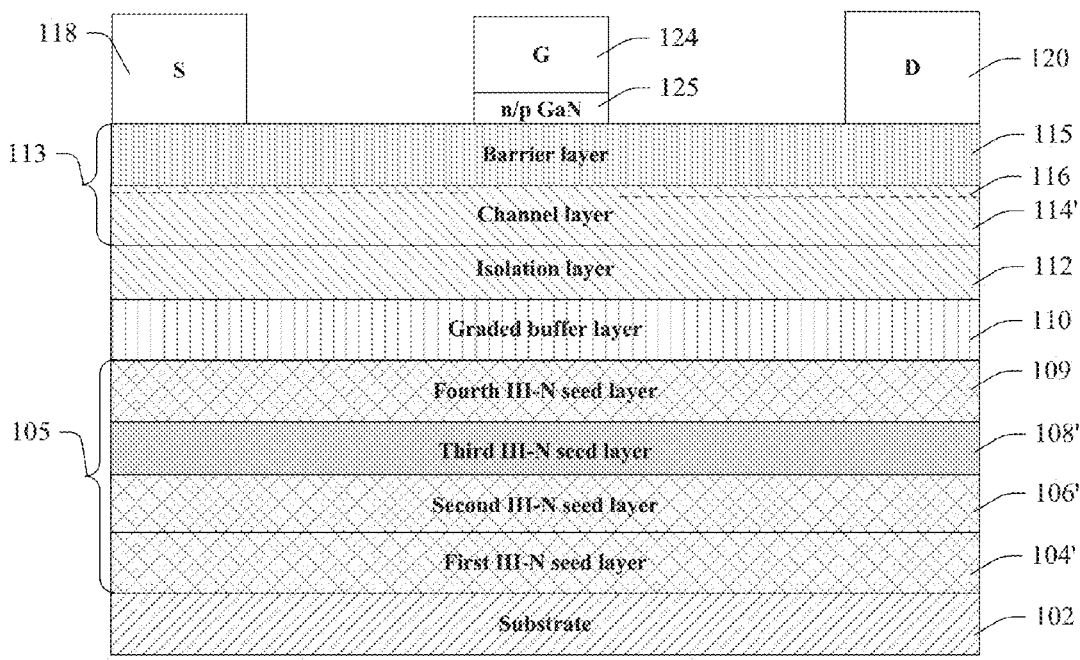
FIG. 4 illustrates some embodiments of a cross sectional view of a III-N HEMT device with a third III-N seed layer formed in accordance with the present disclosure.

FIG. 4 illustrates some embodiments of a cross sectional view of a III-N HEMT device 400 with a third III-N seed layer 108' formed in accordance with the present disclosure. Here, unlike the HEMT structure 300, a doped III-V compound layer 125 separates the gate electrode 124 from the barrier layer 115. In some embodiments, the doped III-V compound layer 125 comprises doped GaN, which pulls the electrons from the 2DEG channel or donates positive ions to the 2DEG channel under the gate electrode 124, making the HEMT device a normally off or an E-mode III-N HEMT device. In some embodiments, the barrier layer 115 of an E-mode HEMT device of structure 400 comprises AlN (0.2-1.5 nm)\Al0.25GaN (10-30 nm)\p-GaN (Mg dopant 8E18~3e19 cm-3, 10-200 nm) or AlN (0.2-1.5 nm)\Al0.25GaN (10-30 nm)\p-GaN (Mg dopant 8E18~3e19 cm-3, 10-200 nm)\n-GaN (Si dopant 5E15~1e17 cm-3, 10-200 nm).

Figure 5:
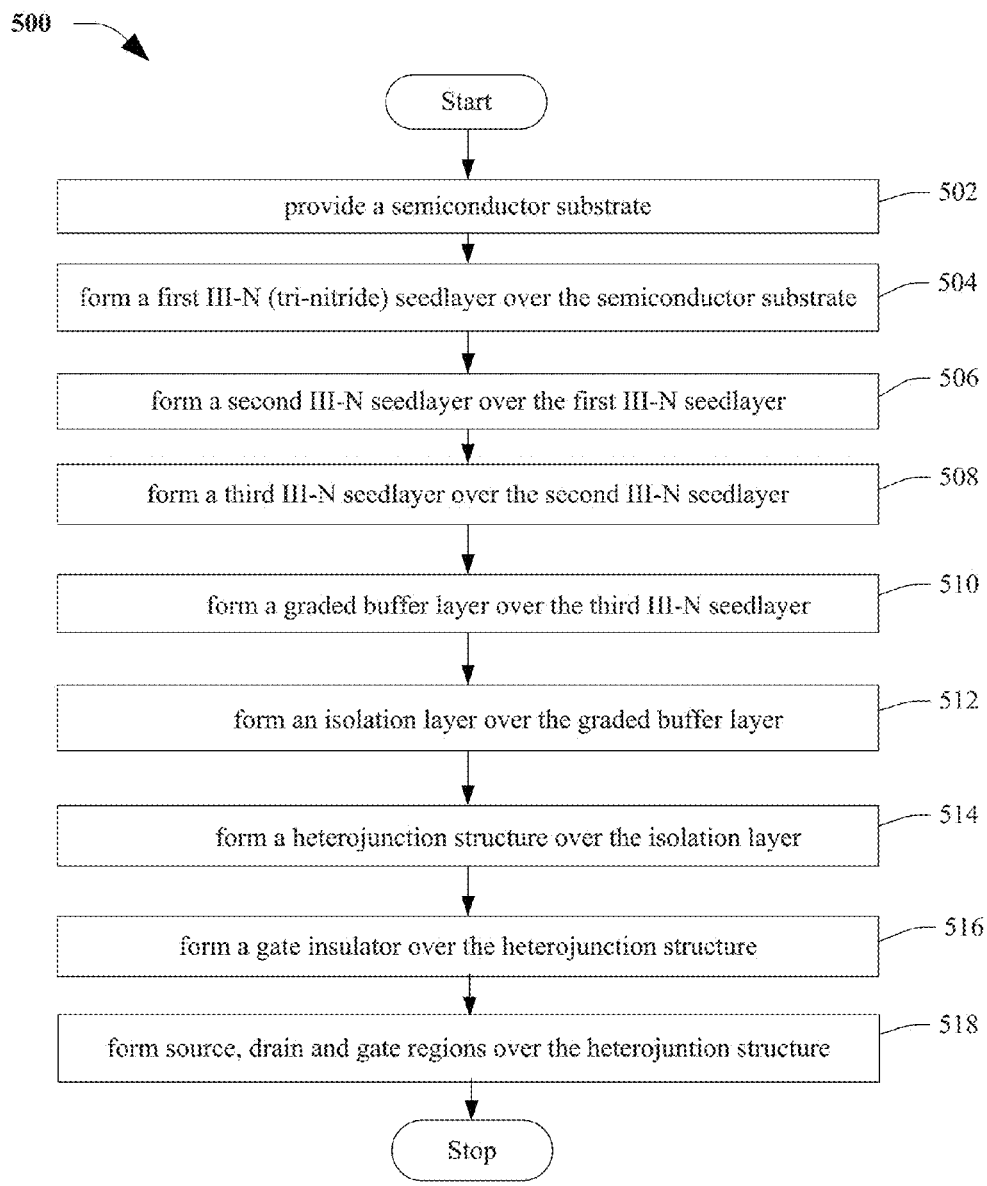
FIG. 5 illustrates a flowchart of some embodiments of a method for manufacturing a semiconductor structure having a third III-N seed layer within a buffer layer, formed according to some embodiments of the present disclosure.

FIG. 5 illustrates a flowchart 500 of some embodiments of a method for manufacturing a semiconductor structure having a third III-N seed layer within a buffer layer, formed according to some embodiments of the present disclosure. While the disclosed method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a substrate is provided. In some embodiments, the semiconductor substrate comprises Si, and can be for example, a silicon wafer with its crystalline structure terminating on a (111) lattice plane. In other embodiments, the substrate can be a sapphire wafer, a silicon-carbide wafer, or a silicon-on-insulator (SOI) wafer.

At 504, a first III-N seed layer is formed over the substrate. In some embodiments, this first III-N seed layer is formed by a low temperature (LT) process and comprises LT AlN.

At 506, a second III-N seed layer is formed over the first III-N seed layer. In some embodiments, the second III-N seed layer is formed by a high temperature (HT) process and comprises HT AlN.

At 508, a third III-N seed layer having a smaller V/III ratio than a V/III ratio of the second III-N seed layer is formed over the second III-N seed layer. In some embodiments the third III-N seed layer is formed by a high temperature (HT) process and comprises HT AlN.

At 510, a graded buffer layer is formed over the third III-N seed layer. In some embodiments, the graded buffer layer comprises AlGaN.

At 512, an isolation layer is formed over the graded buffer layer. In some embodiments, the isolation layer comprises heavily doped GaN having a dopant concentration greater than 1e 19 cm$^{-3}$.

At 514, a heterojunction structure is formed over the isolation layer. In some embodiments, the heterojunction structure comprises AlGaN over GaN. The GaN layer of the heterojunction structure may comprise a doped GaN (UID-GaN) layer, usually referred as unintentionally doped (e.g., a GaN material not having intentionally placed dopants, but rather having a doping resulting from process contaminants, for example). In one embodiment, the UID-GaN layer may have an n-type doping.

At 516, a gate insulator is formed over the heterojunction structure.

At 518, source, drain and gate contacts are formed over the heterojunction structure.

With reference to FIGS. 6-13, cross-sectional views of some embodiments of a semiconductor structure at various stages of manufacture are provided to illustrate the method of FIG. 5. Although FIGS. 6-13 are described in relation to the method 500, it will be appreciated that the structures disclosed in FIGS. 6-13 are not limited to the method 500, but instead may stand alone as structures independent of the method 500. Similarly, although the method 500 is described in relation to FIGS. 6-13, it will be appreciated that the method 500 is not limited to the structures disclosed in FIGS. 6-13, but instead may stand alone independent of the structures disclosed in FIGS. 6-13.

Figure 6:
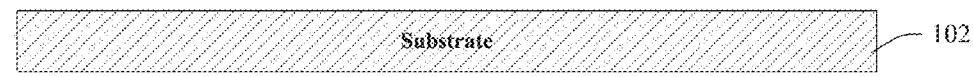

FIG. 6 illustrates a cross-sectional view 600 of some embodiments of a semiconductor structure corresponding to Act 502 of FIG. 5. As illustrated in FIG. 6, a substrate 102 is provided. In some embodiments, the substrate 102 can be a Si, SiC (silicon carbide) or sapphire substrate, often in the form of a circular wafer having a diameter of approximately 100 mm, 130 mm, 150 mm, 200 mm, 300 mm, or 450 mm, for example.

Figure 7:
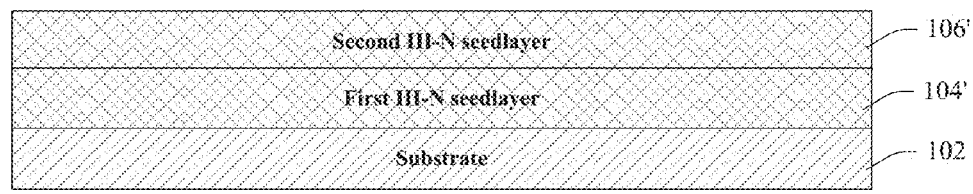

FIG. 7 illustrates a cross-sectional view 700 of a semiconductor structure corresponding to Acts 504 and 506 of FIG. 5. As illustrated, the first III-N seed layer 104' and the second III-N seed layer 106' are formed over the substrate 102. In some embodiments the first III-N seed layer 104' comprises AlN which is grown at a low temperature using growth processes comprising MOCVD (metal organic chemical vapor deposition), MBE (molecular beam epitaxy) or HVPE (hydride vapor pressure epitaxy). In some embodiments the first III-N seed layer 104' is grown at a temperature ranging between 900~1000° C., to a thickness ranging between 20~100 nm. The low temperature promotes a 3D growth mode and a lattice structure of the 3D mode AlN matches well with a lattice structure of the substrate 102. In some embodiments, the second III-N seed layer 106' is formed at a high temperature ranging between 1050~1200° C., to a thickness ranging between 50~200 nm. The V/III ratio of the second III-N seed layer 106' ranges between 2500-5000. A LT AlN seed layer has a cloudy or rough topography whereas a HT AlN seed layer has a smooth topography. Hence, the first III-N seed layer 104' and the second III-N seed layer 106' meet at a saw-toothed interface.

Figure 8:
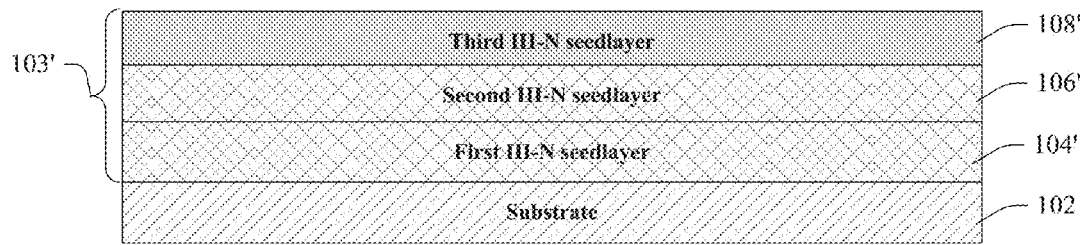

FIG. 8 illustrates a cross-sectional view 800 of a semiconductor structure corresponding to Act 508 of FIG. 5. A third III-N seed layer 108' is formed over the second III-N seed layer 106'. The first, second and third III-N seed layers 104', 106' and 108' respectively, together form a III-N buffer layer 103'. In some embodiments, the third III-N seed layer 108' comprises AlN, which is grown at a high temperature ranging between 1050~1200° C., to a thickness ranging between 30~150 nm. The V/III ratio of the third III-N seed layer 108' ranges between 200-1000. As mentioned earlier, the low V/III ratio of the third III-N seed layer 108' has a lattice structure that matches with GaN and thus it reduces the tensile stress on GaN. Further, the 2D growth mode of the third III-N seed layer 108' helps annihilate or terminate threading dislocations and thus prevents burning out of devices as a result of V-shaped cracks.

FIG. 9 illustrates a cross-sectional view 900 of a semiconductor structure corresponding to Act 510 of FIG. 5. As illustrated in FIG. 9, a graded buffer layer 110 is formed over the buffer layer 103'. As mentioned above the graded buffer layer 110 provides additional lattice matching between the substrate and the III-V device layer formed over it. The graded layer 110 has a chemical formula that varies as a function of depth. For example, the graded layer 110 has a first chemical formula at an interface between the graded layer 110 and the underlying third III-N seed layer 108', and a second chemical formula at an interface between the graded layer 110 and an overlying III-V compound layer. In some embodiments, the graded layer 110 comprises an AlGaN layer. In various embodiments, the graded buffer layer 110 may comprise a chemical formula of $Al_xGa_{1-x}N$, where x is in a range of approximately 0.1 to approximately 0.95 at different positions in the graded layer 110. In some embodiments, the graded AlGaN layer comprises for example, 3X-AlGaN layer, $Al_{0.75}Ga_{0.25}N\backslash Al_{0.5}Ga_{0.5}N\backslash Al_{0.25}Ga_{0.25}N$ or 4X-AlGaN (for example, $Al_{0.75}Ga_{0.25}N\backslash Al_{0.5}Ga_{0.5}N\backslash Al_{0.25}Ga_{0.25}N\backslash Al_{0.1}Ga_{0.9}N$), grown at a temperature ranging between 980~1150° C. to a thickness ranging between 0.2-1.5 um.

FIG. 10 illustrates a cross-sectional view 1000 of a semiconductor structure corresponding to Act 512 of FIG. 5. As illustrated in FIG. 10, an isolation layer 112 is disposed directly over the graded buffer layer 110. In some embodiments, the isolation layer comprises C doped GaN with a C concentration greater than 1e19 $cm^{-3}$. The C dopants in the isolation layer 112 limit or prevent diffusion of Si atoms from the substrate 102 to the layers formed above the isolation layer 112. In some embodiments, the isolation layer 112 is grown to a thickness ranging between 0.1~1.5 um at a temperature ranging between 950~1050° C. In some embodiments the isolation layer 112 is grown as a doped layer over the graded buffer layer 110.

Figure 11:
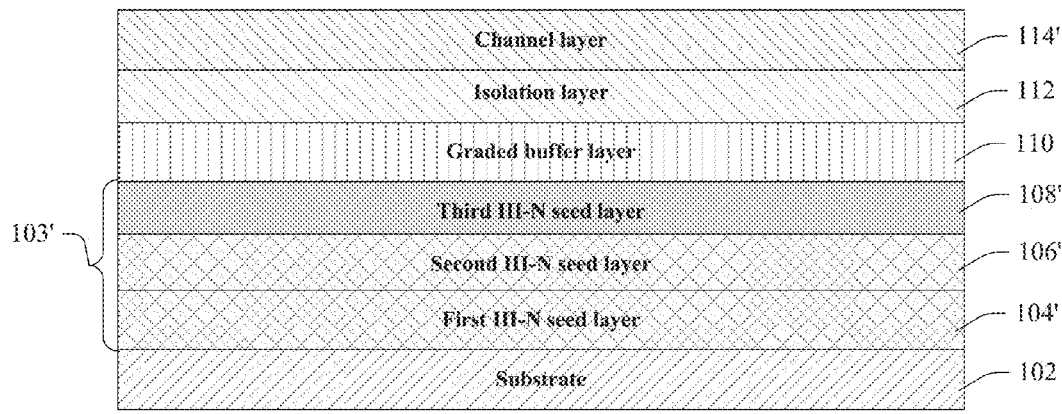

FIG. 11 illustrates a cross-sectional view 1100 of a semiconductor structure corresponding to Act 514 of FIG. 5.

As illustrated in FIG. 11, a III-V channel layer 114' is disposed over the isolation layer 112. The III-V channel layer 114' is part of a heterojunction structure 113. In some embodiments, the III-V channel layer 114' comprises u-GaN having a C concentration less than 1e17 $cm^{-3}$. In some embodiments, the u-GaN thickness ranges between approximately 0.2~1.0 um and it is grown at a temperature ranging between 950~1050° C.

Figure 12:
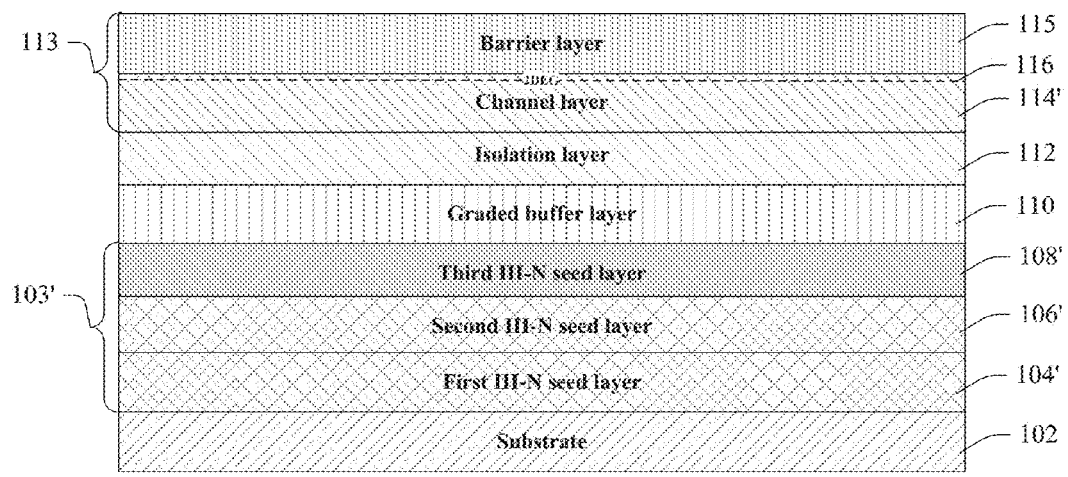

FIG. 12 illustrates a cross-sectional view 1200 of a semiconductor structure corresponding to Act 514 of FIG. 5. Here, a III-V barrier layer 115 is formed over the III-V channel layer 114', completing the formation of the heterojunction structure 113. The III-V barrier layer 115 is used to provide the band gap discontinuity with III-V channel layer 114' to form 2-DEG 116. In some embodiments, the III-V layer 115 comprises $Al_{0.25}GaN$ (10~30 nm), AlN (0.2-1.5 nm)$\backslash Al_{0.25}GaN$ (10-30 nm)$\backslash$u-GaN (2-20 nm), AlN (0.2-1.5 nm)$\backslash Al_{0.25}GaN$ (10-30 nm)$\backslash$p-GaN (Mg dopant 8E18~3e19 $cm^{-3}$, 10-200 nm) or AlN (0.2-1.5 nm)$\backslash Al_{0.25}GaN$ (10-30 nm)$\backslash$p-GaN (Mg dopant 8E18~3e19 $cm^{-3}$, 10-200 nm)$\backslash$n-GaN (Si dopant 5E15~1e17 $cm^{-3}$, 10-200 nm).

Figure 13:
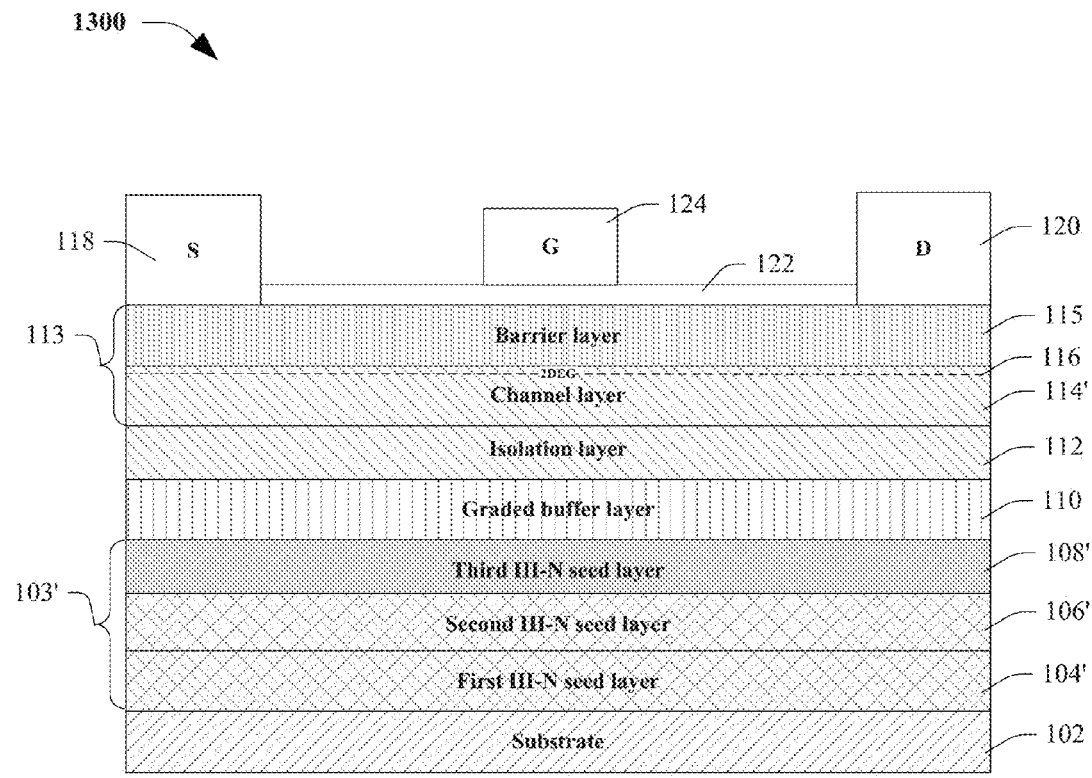

FIG. 13 illustrates a cross-sectional view of a transistor device 1300 corresponding to Acts 516 and 518 of FIG. 5. As illustrated in FIG. 13, source region 118, drain region 120 and a gate insulator 122 are formed over the heterojunction structure 113. A gate electrode 124 is disposed over a specific region of the gate insulator 122. The source region 118 and the drain region 120 are located at two end locations of the barrier layer 115 and the gate electrode 124 is located above the gate insulator 124 between the source region 118 and the drain region 120. When a gate voltage is applied to the gate electrode 124, a device current of the transistor device 1300 is modulated within the 2DEG 116. The 2DEG 116 comprises electrons having a high mobility. In various embodiments, the gate insulator 122 may comprise a silicon nitride (SiN) layer, an aluminum oxide ($AlO_3$ or $Al_2O_3$) layer, a hafnium oxide layer ($HfO_2$), or a silicon dioxide ($SiO_2$) layer. Depending on the use and material used for the gate insulator 122, the semiconductor structure 1300, operates differently. For example, when excluding the gate insulator 122 and introducing a doped III-V compound layer (not shown) under the gate electrode 124, the disclosed transistor device 1300 operates as a high electron mobility transistor (HEMT) device. When using an insulating layer 122 comprising $Al_2O_3$, $HfO_2$, or SiN the disclosed transistor device 1300 operates as a MISFET. When using an insulating layer 122 comprising $SiO_2$, the disclosed transistor device 1300 operates as a MOSFET.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a structure and method of a GaN film on a Si substrate including an additional HT III-N seed layer, which helps in reducing tensile stress on GaN. Thickness of a LT AlN buffer has a critical value after which V-shaped cracks will be formed over the AlN buffer, which will lead to burning out of devices. Reducing the thickness of LT AlN seed layer will pose tensile stress on GaN bulk due to lattice mismatch. The third III-N seed layer has a low V/III ratio compared to the second III-N seed layer and the low crystal quality and the lattice structure of the third III-N seed layer helps in reducing tensile stress on GaN. The HT or third III-N seed layer further helps in annihilating TDs and prevents diffusion of Si atoms from the substrate to active layers of the transistor.

In one embodiment, the present disclosure relates to a first III-V (group III-group V) seed layer disposed over a substrate and having a first ratio of group V atoms to group III atoms, a second III-V seed layer disposed over the first III-V seed layer and having a second ratio of group V atoms to group III atoms, and a third III-V seed layer disposed abutting a top surface of the second III-V seed layer, wherein the third III-V seed layer has a third ratio of group V atoms to group III atoms. The third ratio is different from the second ratio.

In another embodiment, the present disclosure relates to a method of forming a semiconductor device, the method comprising, providing a substrate, forming a first III-V (group III-group V) seed layer over the semiconductor substrate using a first process performed at a first temperature, forming a second III-V seed layer over the first III-V seed layer using a second process performed at a second temperature, which is different from the first temperature, and forming a third III-V seed layer over the second III-V seed layer using a third process performed at a third temperature, which is different from the first temperature.

In yet another embodiment, the present disclosure related to a semiconductor device comprising, a silicon (Si) substrate, a first aluminum nitride (AlN) seed layer disposed over the Si substrate and having a first ratio of Group V atoms to Group III atoms, a second AlN seed layer having a second ratio of Group V atoms to Group III atoms disposed over the first AlN seed layer, and a third AlN seed layer having a third ratio of Group V atoms to Group III atoms disposed over the second AlN seed layer. The second V/III ratio is higher than the third V/III ratio.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first III-V (group III-group V) seed layer disposed over the substrate, wherein the first III-V seed layer has a first ratio of group V atoms to group III atoms;
   a second III-V seed layer disposed over the first III-V seed layer, wherein the second III-V seed layer has a second ratio of group V atoms to group III atoms, wherein the first III-V seed layer and the second III-V seed layer meet at a saw-toothed interface;
   a third III-V seed layer disposed over the second III-V seed layer, wherein the third III-V seed layer has a third ratio of group V atoms to group III atoms, wherein the second ratio is greater than the third ratio so the second III-V seed layer is group-V-poor relative to the third III-V seed layer; and
   at least one device layer of III-V material disposed over the third III-V seed layer.

2. The semiconductor device of claim 1, wherein the substrate is a silicon substrate, sapphire substrate, or silicon carbide substrate.

3. The semiconductor device of claim 1, wherein the at least one device layer of III-V material comprises:
   a first III-V device layer having a first bandgap; and
   a second III-V device layer having a second bandgap that differs from the first bandgap, wherein the first and second III-V device layers meet at a heterojunction interface.

4. The semiconductor device of claim 3, wherein the first bandgap is less than the second bandgap.

5. The semiconductor device of claim 3, further comprising:
   a graded buffer layer disposed over the third III-V seed layer; wherein concentration of group III atoms of the graded buffer layer varies as a function of depth; and
   an isolation layer disposed between the graded buffer layer and the first III-V device layer.

6. The semiconductor device of claim 5, wherein:
   the first, the second, and the third III-V seed layers comprise AlN (aluminum nitride);
   the graded buffer layer comprises AlGaN (aluminum gallium nitride);
   the isolation layer comprises GaN (gallium nitride); and
   at least one of the first or second III-V device layers comprise AlGaN.

7. The semiconductor device of claim 1, wherein a thickness of the first III-V seed layer ranges from approximately 20 nm to approximately 100 nm, a thickness of the second III-V seed layer ranges from approximately 50 nm to approximately 500 nm and a thickness of the third III-V seed layer ranges from approximately 30 nm to approximately 150 nm.

8. The semiconductor device of claim 1, wherein the first seed layer is grown at a first temperature, the second seed layer is grown at a second temperature, and the third seed layer is grown at a third temperature, wherein the first temperature is less than each of the second and third temperatures.

9. A semiconductor device comprising:
   a silicon (Si) substrate;
   a first aluminum nitride (AlN) seed layer disposed over the Si substrate and having a first ratio of group V atoms to group III atoms;
   a second AlN seed layer having a second ratio of group V atoms to group III atoms disposed over the first AlN seed layer, wherein the first AlN seed layer and the second AlN seed layer meet at a saw-toothed interface;
   a third AlN seed layer having a third ratio of group V atoms to group III atoms disposed over the second AlN seed layer, wherein the third ratio is less than the second ratio so the third III-V seed layer is group-V-rich relative to the second III-V seed layer; and
   a GaN device layer over the third AlN seed layer.

10. The semiconductor device of claim 9, wherein the second ratio ranges from approximately 2500-5000:1 and the third ratio ranges from approximately 200-1000:1.

11. The semiconductor device of claim 9, wherein the saw-toothed interface is made up of a series of irregularly spaced peaks and valleys, wherein respective peaks have different heights and respective valleys have different depths as measured from an uppermost surface of the Si substrate.

12. The semiconductor device of claim 11, wherein the first AlN seed layer is in direct contact with the second AlN seed layer, and the second AlN seed layer is in direct contact with the third AlN seed layer.

13. The semiconductor device of claim 12, wherein a first thickness of the first AlN seed layer is less than a second thickness of the second AlN seed layer, and wherein a third thickness of the third AlN seed layer is greater than the first thickness and less than the second thickness.

14. The semiconductor device of claim 9, wherein the second thickness is more than twice as large as the first thickness, and the third thickness is closer to the first thickness than to the second thickness.

15. The semiconductor device of claim 5, wherein a lower portion of the graded buffer layer is in direct contact with the third III-V seed layer, and an upper portion of the graded buffer layer is in direct contact with the isolation layer.

16. The semiconductor device of claim 15, wherein the at least one device layer is in direct contact with the isolation layer.

17. The semiconductor device of claim 1, wherein a first thickness of the first III-V seed layer is less than a second thickness of the second III-V seed layer, and wherein a third thickness of the third III-V seed layer is greater than the first thickness and less than the second thickness.

18. The semiconductor device of claim 2, wherein the saw-toothed interface includes a series of peaks and valleys which are irregularly spaced, wherein respective peaks have different heights and respective valleys have different depths as measured from an uppermost surface of the substrate.

19. A semiconductor device, comprising:
a substrate;
a first III-V (group III-group V) seed layer disposed over the substrate, wherein the first III-V seed layer has a first ratio of group V atoms to group III atoms;
a second III-V seed layer disposed over the first III-V seed layer, wherein the second III-V seed layer has a second ratio of group V atoms to group III atoms, wherein the first III-V seed layer and the second III-V seed layer meet at a saw-toothed interface;
a third III-V seed layer disposed over the second III-V seed layer, wherein the third III-V seed layer has a third ratio of group V atoms to group III atoms, wherein the second ratio is greater than the third ratio so the second III-V seed layer is group-V-poor relative to the third III-V seed layer;
a graded buffer layer disposed over the third III-V seed layer; wherein concentration of group III atoms of the graded buffer layer varies as a function of depth;
an isolation layer disposed over the graded buffer layer; and
a III-V device layer disposed over the isolation layer.

20. The semiconductor device of claim 19, wherein the first III-V seed layer has a lower surface in direct contact with an upper surface of the substrate, the second III-V seed layer has a lower surface in direct contact with an upper surface of the first III-V seed layer, the third III-V seed layer has a lower surface in direct contact with an upper surface of the second III-V seed layer, and the graded buffer layer has a lower surface in direct contact with an upper surface of the third III-V seed layer.

* * * * *